(12) United States Patent
Yui

(10) Patent No.: US 7,579,834 B2
(45) Date of Patent: Aug. 25, 2009

(54) MAGNETIC RESONANCE IMAGING APPARATUS AND MAGNETIC RESONANCE IMAGING METHOD

(75) Inventor: Masao Yui, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 0 days.

(21) Appl. No.: 12/076,387

(22) Filed: Mar. 18, 2008

(65) Prior Publication Data

US 2008/0238422 A1    Oct. 2, 2008

(30) Foreign Application Priority Data

Mar. 26, 2007  (JP) .............................. 2007-078568
Jan. 30, 2008  (JP) .............................. 2008-018965

(51) Int. Cl.
    *G01V 3/00* (2006.01)
(52) U.S. Cl. ...................................... 324/307; 324/309
(58) Field of Classification Search ......... 324/300–322; 600/407–445; 702/19–32, 85–92, 124–126; 382/128–134
    See application file for complete search history.

(56) References Cited

U.S. PATENT DOCUMENTS

| | | | |
|---|---|---|---|
| 6,608,479 B1* | 8/2003 | Dixon et al. | 324/307 |
| 7,365,537 B2* | 4/2008 | Miyoshi et al. | 324/307 |
| 2005/0007112 A1 | 1/2005 | Deimling | |
| 2005/0179432 A1 | 8/2005 | Miyoshi et al. | |
| 2007/0285090 A1* | 12/2007 | Ikezaki | 324/307 |
| 2008/0258723 A1* | 10/2008 | Abe | 324/307 |

FOREIGN PATENT DOCUMENTS

| | | |
|---|---|---|
| JP | 09-506 A | 1/1997 |
| JP | 2002-136499 A | 5/2002 |

OTHER PUBLICATIONS

Rehwald et al., "Noninvasive cineangiography by magnetic resonance global coherent free precession", *Nature Medicine*, vol. 10, No. 5, May 2004, pp. 545-549.

Scheffler et al., "Magnetization Preparation During the Steady State: Fat-Saturated 3D TrueFISP", *Magnetic Resonance in Medicine*, vol. 45, 2001, pp. 1075-1080.

Extended European Search Report dated Apr. 2, 2009 in EP 08004825.9.

(Continued)

*Primary Examiner*—Brij B Shrivastav
(74) *Attorney, Agent, or Firm*—Nixon & Vanderhye PC

(57) ABSTRACT

A magnetic resonance imaging apparatus includes a data acquisition unit and an image data generating unit. The data acquisition unit acquires data according to a sequence derived by adding a coherent control pulse on a Steady-State Free Precession pulse sequence for repeating plural radio frequency excitations with a constant interval. The coherent control pulse has a center at a substantially center time between adjacent radio frequency excitations and a zero-order moment of which amount is zero. The image data generating unit generates image data based on the data.

25 Claims, 9 Drawing Sheets

OTHER PUBLICATIONS

Overall, W.R., et al., "Oscillating Dual-Equilibrium Steady-State Angiography," Magnetic Resonance in Medicine, Academic Press, Duluth, MN, US, vol. 47, No. 3, Mar. 1, 2002, pp. 513-522, XP001172467, ISSN: 0740-3194.

Flask C.A., et al., "Radial Alternating TE Sequence for Faster Fat Suppression," Magnetic Resonance in Medicine, Academic Press, Duluth, MN, US, vol. 50, No. 5, Nov. 1, 2003, pp. 1095-1099, XP008048304, ISSN: 0740-3194.

Lin H-Y, et al., "Blood Attenuation With SSFP-Compatible Saturation (BASS)," Journal of magnetic Resonance Imaging, Society for Magnetic Resonance Imaging, Oak Brook, IL, US, vol. 24, Aug. 4, 2006, pp. 701-707, XP002446793, ISSN: 1053-1807.

Overall, W.R. et al., "Steady-State Sequence Synthesis," International Society for Magnetic Resonance in Medicine, Scientific Meeting and Exhibition, Proceedings, International Society for Magnetic Resonance in Medicine, US, Jan. 1, 2002, p. 1, XP002327461, ISSN: 1524-6965.

Vasanawala, S.S., et al., "Linear Combination of Steady-State Free Precession MRI," Magnetic Resonance in Medicine, Academic Press, Duluth, MN, US, vol. 43, Jan. 1, 2000, pp. 82-90, XP002232807, ISSN: 0740-3194.

Vasanawala, S.S., et al., "Fluctuating Equilibrium MRI," Magnetic Resonance in Medicine, Academic Press, Duluth, MN, US, vol. 42, Jan. 1, 1999, pp. 876-883, XP002327463, ISSN: 0740-3194.

Scheffler, K et al., "Magnetization preparation during the steady state: fat-saturated 3D TrueFISP," Magnetic Resonance in Medicine, Academic Press, Duluth, MN, US, vol. 45, Jun. 1, 2001, pp. 1075-1080, XP002294388, ISSN: 0740-3194.

Scheffler, K et al., "Magnetization preparation during the steady state: fat-saturated 3D TrueFISP," Magnetic Resonance in Medicine, Academic Press, Duluth, MN, US, vol. 45, Jun. 1, 2001, pp. 1075-1080, XP002294388, ISSN: 0740-3194.

* cited by examiner

MAGNETIC RESONANCE IMAGING APPARATUS AND MAGNETIC RESONANCE IMAGING METHOD

BACKGROUND OF THE INVENTION

1. Field of the Invention

The present invention relates to a magnetic resonance imaging apparatus and a magnetic resonance imaging method which excite nuclear spin of an object magnetically with a RF (radio frequency) signal having the Larmor frequency and reconstruct an image based on a MR (magnetic resonance) signal generated due to the excitation, and more particularly, to a magnetic resonance imaging apparatus and a magnetic resonance imaging method which acquire a magnetic resonance image by using SSFP (Steady-State Free Precession).

2. Description of the Related Art

Magnetic Resonance Imaging (MRI) is an imaging method which excite nuclear spin of an object set in a static magnetic field with a RF signal having the Larmor frequency magnetically and reconstruct an image based on a MR signal generated due to the excitation. A magnetic resonance imaging apparatus operates according to a pulse sequence to define an imaging condition. In a recent magnetic resonance imaging apparatus, a pulse sequence using phenomenon called SSFP (SSFP sequence) for cardiac cine imaging and coronary imaging is often used.

FIG. 1 is a diagram showing a conventional SSFP sequence.

In FIG. 1, RF denotes RF signals to be transmitted to an object, Gss denotes slice gradient magnetic field pulses to be applied to an object for slice selection, Gro denotes RO (readout) gradient magnetic field pulses to be applied to an object for readout of echo data from the object (also referred to as frequency encode gradient magnetic field pulses), Gpe denotes PE (phase encode) gradient magnetic field pulses to be applied to an object for phase encode.

A SSFP sequence is a sequence to acquire echo data with making a magnetization spins in a static magnetic field into a steady state by repeating an RF excitation. Specifically, as shown in FIG. 1, in the SSFP sequence, subsequently to an application of a $+\alpha/2$ excitation pulse or a $-\alpha/2$ excitation pulse for start up, a $+\alpha$ excitation pulse (flip pulse) and a $-\alpha$ excitation pulse are applied repeatedly in mutual with a constant repetition time (TR). Then, a magnetized spin in a static magnetic field is maintained on a steady state by applying the $+\alpha$ excitation pulse and the $-\alpha$ excitation pulse. Generally, each of the $\pm\alpha$ excitation pulses is applied with a slice gradient magnetic field pulse Gss for a selective excitation of a desired slice. An RO gradient magnetic field pulse Gro and a PE gradient magnetic field pulse Gpe are also applied for adding space information. Note that, it is not necessary that the $+\alpha/2$ excitation pulse or the $-\alpha/2$ excitation pulse for start up is applied.

Each integration value of a slice gradient magnetic field pulse Gss, an RO gradient magnetic field pulse Gro and a PE gradient magnetic field pulse Gpe in a TR is controlled to be zero. An applied phase of an excitation pulse is controlled to shift linearly by a constant angle. Generally, a constant angle is set to be 180-degree for an on-resonance spin.

Since the SSFP sequence as mentioned above doesn't spoil a part of signal, obtaining an image with relatively high SN (signal to noise) ratio rapidly is a great advantage. While a SSFP sequence can obtain a constant image contrast by maintaining a steady state, the demand for obtaining different image contrast without lack of the merit above mentioned is increasing.

A SSFP image with a fat saturation is an example demanded for different image contrast. It is known that fat has strong signal in the steady-state since a fat has relatively short longitudinal relaxation (T1) time. Therefore, when an abdominal image is obtained by a SSFP sequence, there is a case that it is difficult to depict anatomical structure and lesions due to strong fat signal. Consequently, fat suppression is required to obtain an abdominal image by a SSFP sequence.

To the contrary, a fat suppuression technique is devised by setting the interval called preparation block in a SSFP sequence and applying a pre-pulse for fat saturation in the preparation block (see, for example, Scheffler et al., Magnetic Resonance in Medicine Vol. 45 page 1075-1080 (2001)).

FIG. 2 is a diagram showing a conventional SSFP sequence with a preparation block.

FIG. 2 shows RF signals applied to an object in time series. As shown in FIG. 2, in a SSFP sequence with a preparation block, subsequently to an application of a $-\alpha/2$ excitation pulse for start up, an excitation pulse train with a certain excitation angle $\pm\alpha$ is applied. Further, on the excitation pulse train, a $+\alpha/2$ flip back pulse is applied. After applying the $+\alpha/2$ flip back pulse, the interval called preparation block is set. Subsequently to the preparation block, a $+\alpha/2$ start up pulse is applied. Then, after applying the $+\alpha/2$ start up pulse, an application of the $\alpha$ excitation pulse train with a certain excitation angle $\pm\alpha$ is restarted.

In a preparation block, so called RF pre-pulse such as a fat saturation pulse is applied for suppressing a fat signal. The character of this method is to set a preparation block under a state in which a spin is stored as a longitudinal magnetization by a $\alpha/2$ flip back pulse. In a preparation block, generally, a spoiler gradient magnetic field pulse for spoiling a transverse magnetization is applied in addition to an RF pre-pulse. As described above, in a SSFP sequence, a preparation block is set for varying an image contrast.

Further, conventionally, a SSFP sequence is also used for imaging by an inversion recovery (IR) method. IR is an imaging method that applies a 180-degree IR pulse to obtain an image with signal intensity depending on recovery due to T1 from a state in which a spin is inverted.

FIG. 3 is a diagram showing a conventional SSFP sequence with an IR pulse.

In FIG. 3, RF denotes RF signals to be transmitted to an object, Gss denotes slice gradient magnetic field pulses, Gro denotes RO gradient magnetic field pulses, Gpe denotes PE gradient magnetic field pulse.

When an IR pulse is applied in a SSFP sequence, as shown in FIG. 3, application of the $\alpha$ excitation pulses applied continuously with the TR is stopped once. Then, after a spoiler pulse is applied subsequently to the IR pulse, application of continuous excitation pulses is restarted again. Note that, a start up pulse or a flip back pulse is occasionally used together.

In addition, a GCFP (global coherent free precession) method is proposed as an applicable tagging technology in a SSFP sequence. The GCFP method is a technology which applies coherent spin labeling. Specifically, the GCFP method is a technique to catch only a proton, passing a MRI scan cross-section, of water molecule in blood cells with a radio frequency wave when the proton passes the MRI scan cross-section, i.e. tagging technology.

In a conventional SSFP sequence with a preparation block, the T1 relaxation of a spin progresses in the period from the $\alpha/2$ flip back pulse to the $\alpha/2$ start up pulse. In addition, in a preparation block, phase continuity of a spin is destroyed by applying an RF pre-pulse or by applying a spoiler gradient magnetic field pulse. It is reported that effect due to progression of T1 relaxation of a spin and destruction of phase continuity of a spin is a little in water component showing a long T1. However, there is a problem that effect due to progression of T1 relaxation of a spin and destruction of phase continuity of a spin is not negligible on tissues each having a short T1 in a living body.

That is, on the process of a SSFP sequence, T1 relaxation occurs due to applying a α/2 flip back pulse and a α/2 start up pulse and by setting a preparation block, and therefore, a blocking of phase continuity occurs due to the preparation block. T1 relaxation and the blocking of phase continuity are factors to vary an image contrast obtained by a SSFP sequence. Accordingly, there is a possibility that an image artifact appears due to a shift from a SSFP state.

Therefore, a method that keeping phase continuity of a spin in a SSFP sequence and varying an image contrast by an RF pre-pulse can be achieved at the same time is required.

In a conventional SSFP sequence with a IR pulse, since an application of a α excitation pulse stops in the middle, the first spin after an application of an excitation pulse is restarted is in a state different from a steady state. This result caused contrast variation of an image and appearance of an artifact.

In addition, a slice gradient magnetic field and an RO gradient magnetic field are common and fixed in the GCFP method. Further, the GCFP method has a disadvantage that a radial acquisition cannot be performed since applying direction of a PE gradient magnetic field pulse is limited in the direction perpendicular to a slice.

SUMMARY OF THE INVENTION

The present invention has been made in light of the conventional situations, and it is an object of the present invention to provide a magnetic resonance imaging apparatus and a magnetic resonance imaging method which make it possible to change image contrast by a pulse for a desired object such as labeling, fat-saturation and inversion with keeping phase continuity of spins in imaging under a SSFP sequence.

The present invention provides a magnetic resonance imaging apparatus comprising: a data acquisition unit configured to acquire data according to a sequence derived by adding a coherent control pulse on a Steady-State Free Precession pulse sequence for repeating plural radio frequency excitations with a constant interval, the coherent control pulse having a center at a substantially center time between adjacent radio frequency excitations and a zero-order moment of which amount is zero; and an image data generating unit configured to generate image data based on the data, in an aspect to achieve the object.

The present invention also provides a magnetic resonance imaging method comprising: acquiring data according to a sequence derived by adding a coherent control pulse on a Steady-State Free Precession pulse sequence for repeating plural radio frequency excitations with a constant interval, the coherent control pulse having a center at a substantially center time between adjacent radio frequency excitations and a zero-order moment of which amount is zero; and generating image data based on the data, in an aspect to achieve the object.

The magnetic resonance imaging apparatus and the magnetic resonance imaging method as described above make it possible to change image contrast by a pulse for a desired object such as labeling, fat-saturation and inversion with keeping phase continuity of spins in imaging under a SSFP sequence.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
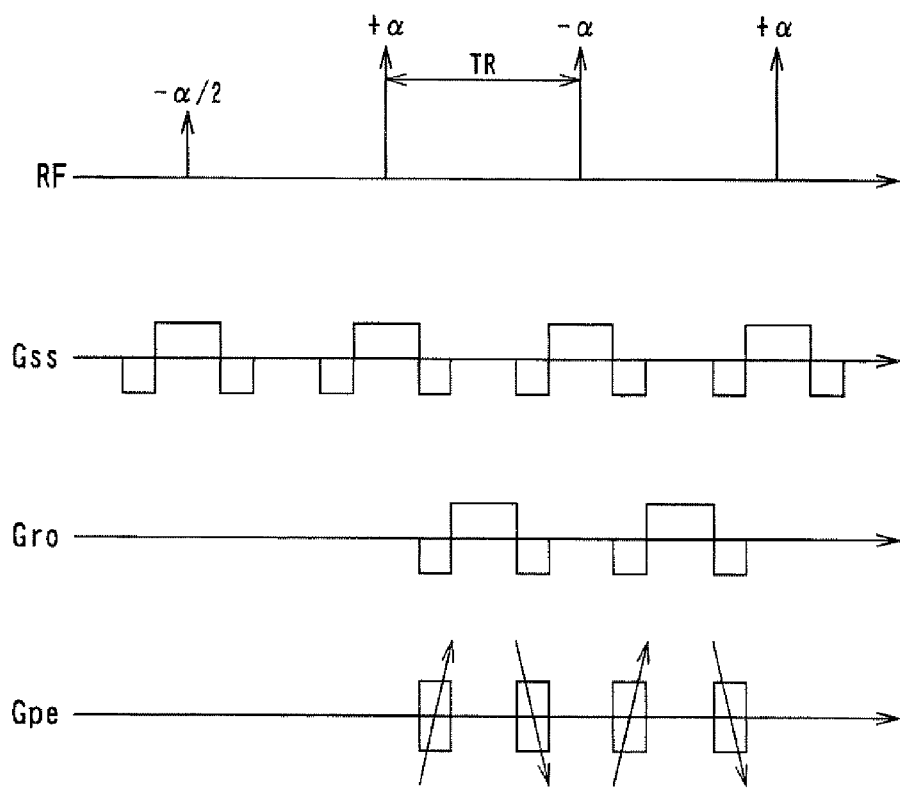
FIG. 1 is a diagram showing a conventional SSFP sequence.
Figure 2:
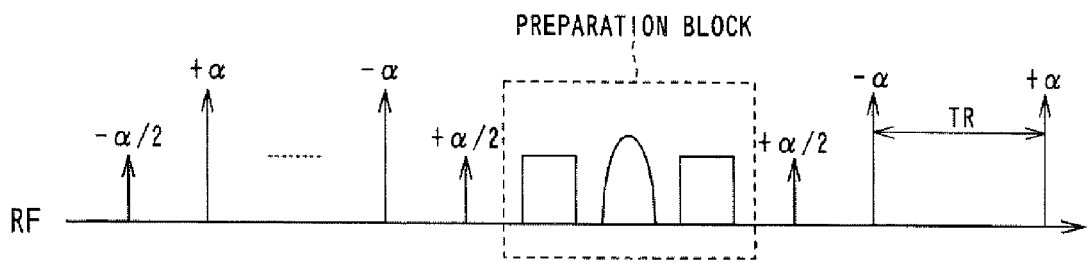
FIG. 2 is a diagram showing a conventional SSFP sequence with a preparation block.
Figure 3:
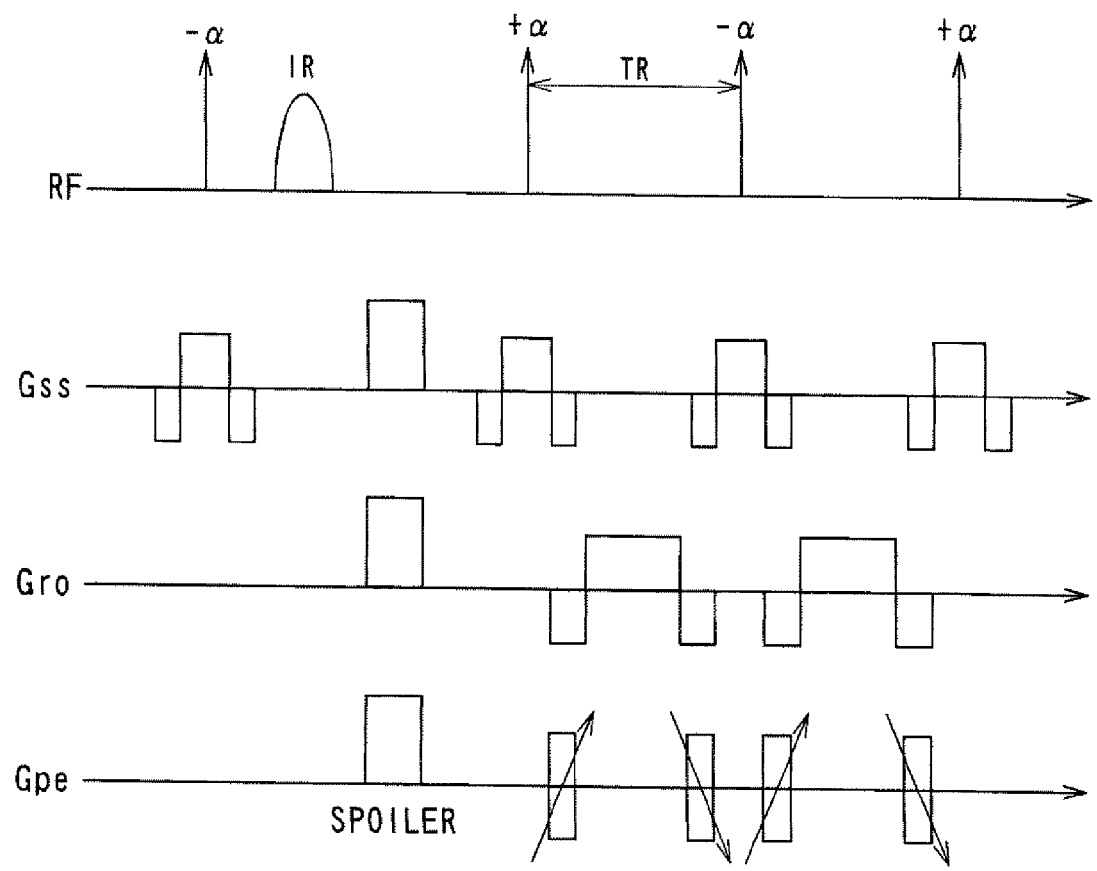
FIG. 3 is a diagram showing a conventional SSFP sequence with an IR pulse.
Figure 4:
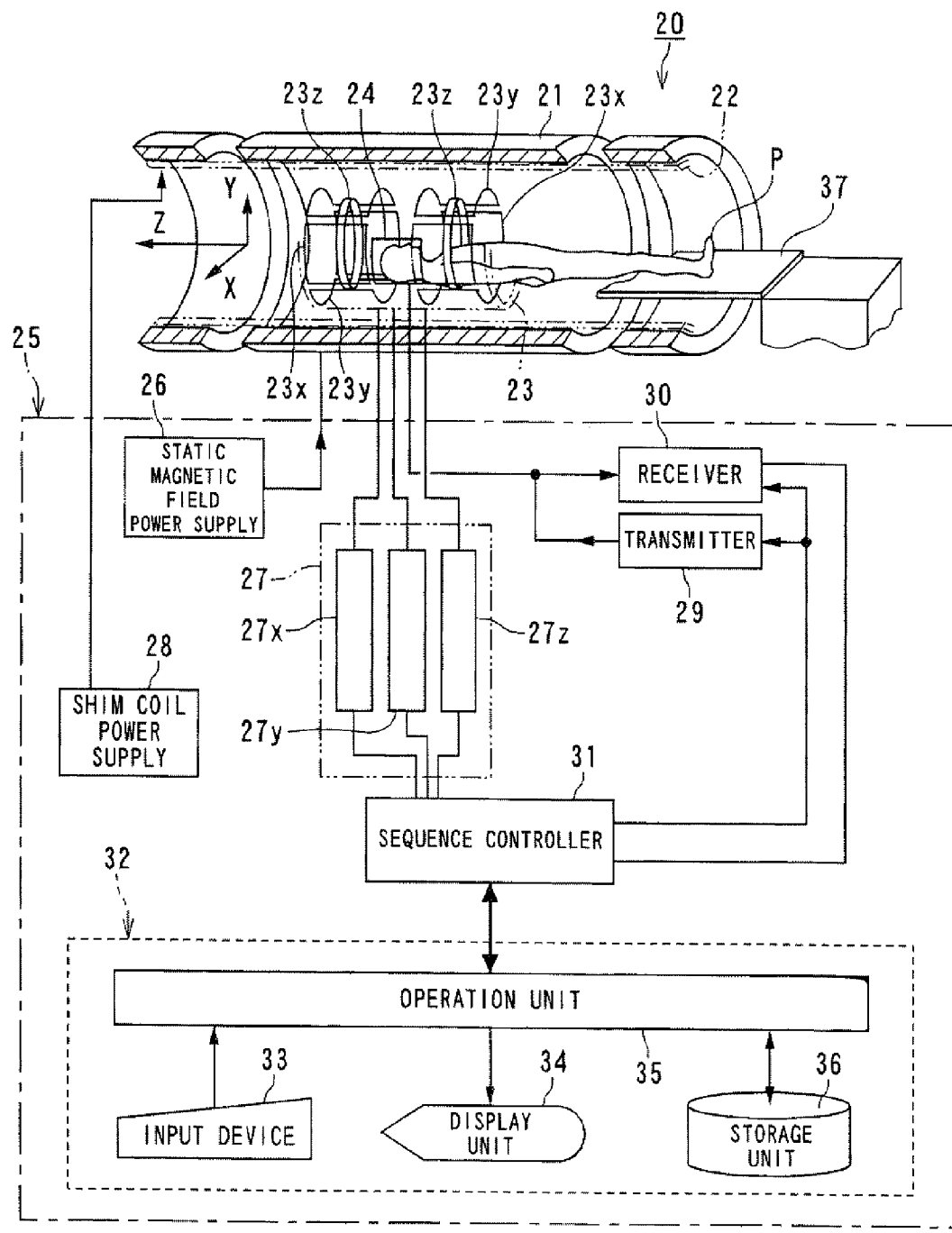
FIG. 4 is a block diagram showing a magnetic resonance imaging apparatus according to an embodiment of the present invention.

FIG. 4 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a NMR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex number data obtained through the detection of a NMR signal and A/D conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex data by detecting a NMR signal given from the RF coil 24 and performing predetermined signal processing and A/D converting to the NMR signal detected. The receiver 30 also has a function to give the generated raw data to the sequence controller 31.

The computer 32 gets various functions by the operation unit 35 executing some programs stored in the storage unit 36 of the computer 32. The computer 32 may include some specific circuits instead of using some of the programs.

Figure 5:
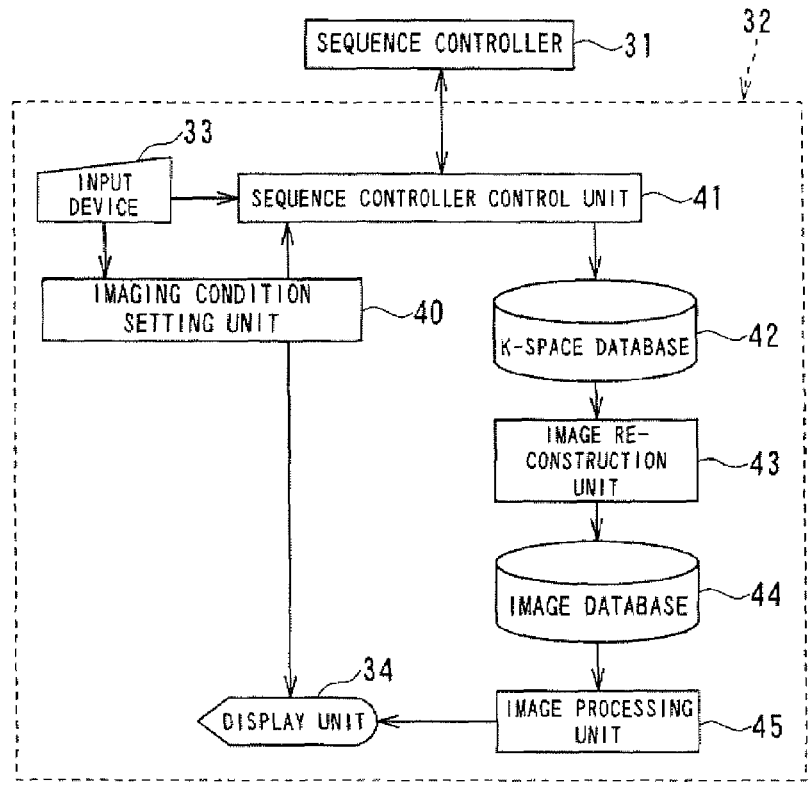
FIG. 5 is a functional block diagram of the computer shown in FIG. 4.

FIG. 5 is a functional block diagram of the computer 32 shown in FIG. 4.

The computer 32 functions as an imaging condition setting unit 40, a sequence controller control unit 41, a k-space database 42, an image reconstruction unit 44, an image database 44 and an image processing unit 45 by program.

The imaging condition setting unit 40 has a function to set the imaging condition such as a pulse sequence based on the instruction information from the input device 33 and provide the set imaging condition to the sequence controller control unit 41. Therefore, the imaging condition setting unit 40 has a function to display screen information for setting of an imaging condition on the display unit 34. Specifically, the imaging condition setting unit 40 is configured to be able to set a SSFP sequence as an imaging condition. In addition, an application of an RF coherent control pulse with a desired purpose for varying an image contrast can be added to a SSFP sequence so as to maintain phase continuity of a spin.

Figure 6:
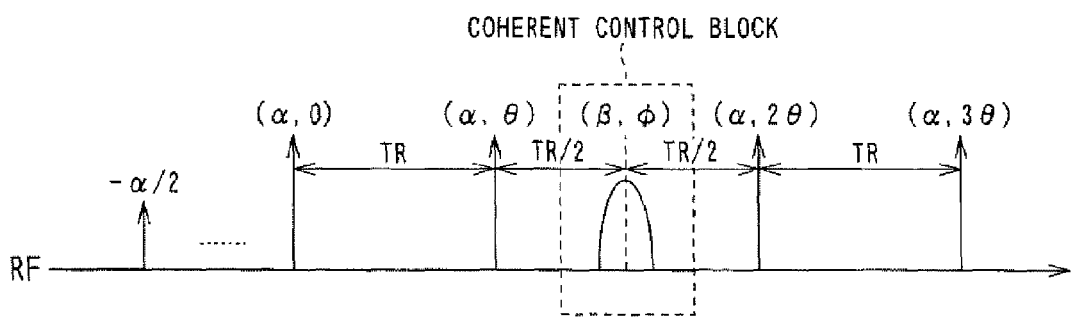
FIG. 6 is a diagram showing a SSFP sequence with applying an RF coherent control pulse set by the imaging condition setting unit shown in FIG. 5.

FIG. 6 is a diagram showing a SSFP sequence with applying an RF coherent control pulse set by the imaging condition setting unit 40 shown in FIG. 5.

In FIG. 6, RF denotes RF pulses to be applied to the object P. As shown in FIG. 6, in a SSFP sequence, subsequently to applying a $\alpha/2$ start up pulse which excites a spin by $+\alpha/2$ or $-\alpha/2$ angle, plural $\alpha$ excitation pulses are applied repeatedly at regular intervals (TR). The respective $\alpha$ excitation pulses are excitation pulses which tilt a spin by a certain angle $\alpha$ so that a phase of the spin is $0, \theta, 2\times\theta, 3\times\theta, \ldots$ respectively.

Then, a coherent control block is set in a TR between arbitrary adjacent excitation pulses in the process of a SSFP sequence. FIG. 6 shows an example of coherent control block set between a $(\alpha, \theta)$ excitation pulse tilting a spin by a certain angle $\alpha$ and rotating a phase of the spin into $\theta$ and a $(\alpha, 2\theta)$ excitation pulse tilting a spin by a certain angle $\alpha$ and rotating a phase of the spin into $2\times\theta$.

In a coherent control block, a $(\beta, \phi)$ RF coherent control pulse tilting a spin by an arbitrary angle $\beta$ and rotating a phase of the spin into $\phi$ is applied. A waveform, an excitation angle and an excitation phase of an RF coherent control pulse can be determined according to an application purpose of the RF coherent control pulse arbitrarily. That is, an RF coherent control pulse can be an arbitrary pulse for varying an image contrast, such as a pulse for labeling, a fat saturation pulse and an inversion pulse.

The center of a waveform of an RF coherent control pulse is controlled so as to locate at the substantial center between adjacent α excitation pulses. That is, an imaging condition is set so that the center of a waveform of an RF coherent control pulse locates at the location temporally TR/2 away from adjacent excitation pulses respectively.

Note that, depending on an application purpose of an RF coherent control pulse, acquiring data for imaging may not be needed while it is preferable to maintain a steady state of magnetization on application timing of single or plural excitation pulse/pulses before or after a coherent control block. Therefore, the arbitrary number of excitation pulses before or after a coherent control block may be as dummy pulses which don't acquire data used for imaging. For example, when a fat saturation pulse is applied as an RF coherent control pulse, excitation pulses applied while a magnetization in a fat tilts by an application of the fat saturation pulse and sufficient fat saturation effect is obtained can be as dummy pulses.

Figure 7:
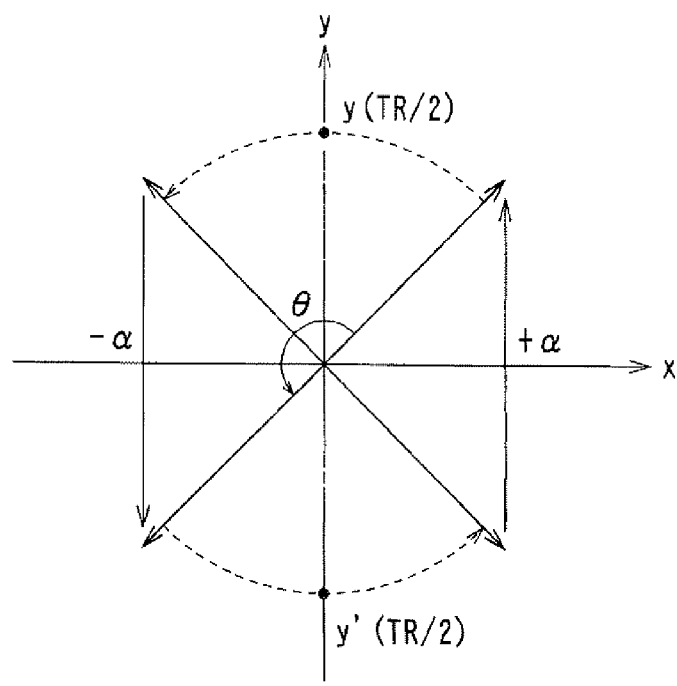
FIG. 7 is a diagram showing an angle of spins changing by performing the SSFP sequence having a coherent control block shown in FIG. 6.

FIG. 7 is a diagram showing an angle of spins changing by performing the SSFP sequence having a coherent control block shown in FIG. 6.

As shown in FIG. 7, in a SSFP sequence, when a +α/2 start up pulse is applied, a spin direction of proton becomes in a state tilted from x axis direction. When time elapses by a TR, a spin direction of the proton tilts in the direction symmetric to y axis. Here, when a −α excitation pulse to rotate a spin by a certain angle −α is applied, the spin direction tilts in the direction symmetric to x axis. Further, when time elapses by a TR, the spin direction tilts in the direction symmetric to y axis. When a +α excitation pulse to rotate a spin by a certain angle +α is applied, the spin direction tilts in the direction symmetric to x axis. That is, the spin direction is restored to an original angle by twice applications of α excitation pulse.

Therefore, when time elapses by TR/2 after to an application of a certain α excitation pulse, the spin direction becomes in y axis direction y(TR/2). Therefore, when, for example, a 180-degree RF coherent control pulse is applied so as to excite the target spin at the timing the spin direction is in y axis direction y(TR/2), the spin direction of the target spin is on y axis y'(TR/2) though it tilts symmetrically to x axis. Therefore, when a 180-degree RF coherent control pulse is applied at the timing at which time elapses by TR/2 after an application of α excitation pulse, the spin direction can maintain the continuity without affecting by 180-degree RF coherent control pulse.

If the continuity cannot be maintained by effect of an RF coherent control pulse on the spin, an artifact is occurred on an image. Therefore, it is not necessary that the timing for application of an RF coherent control pulse is the timing at which time passes by TR/2 after applying an α excitation pulse rigorously. The timing for application of an RF coherent control pulse may be the timing to maintain the continuity of spin direction at the degree that an artifact can be reduced sufficiently. That is, application timing of an RF coherent control pulse may be in the error range determined by setting the point passed after applying an excitation pulse by TR/2 to a center rigorously. As a specific example, the timing for an application of an RF coherent control pulse can be set in the range TR/2±TR/4 after applying an α excitation pulse.

As mentioned above, in a coherent control block, an imaging condition is controlled so that phase continuity of a target spin is maintained. For example, when a stationary spin is a target, zero-order moment amount in a coherent control block is adjusted to be zero so that a phase of a stationary spin is retained. Therefore, an imaging condition is determined so that application areas of gradient magnetic field pulses in a coherent control block are zero.

Note that, since FIG. 6 shows an example in which a gradient magnetic field pulse isn't applied in a coherent control block, originally zero-order moment amount in a coherent control block is zero.

Figure 8:
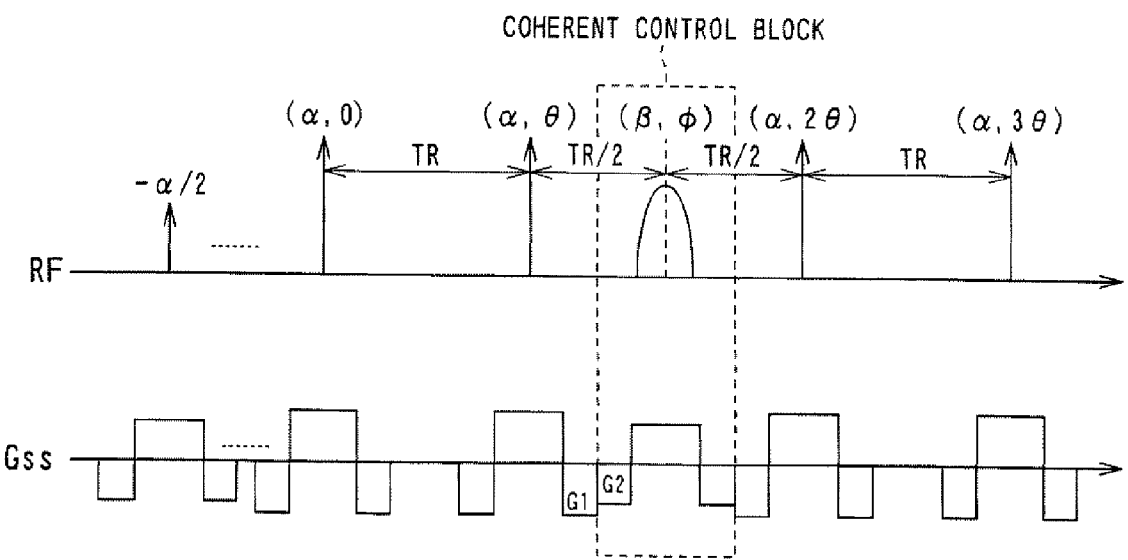
FIG. 8 is a diagram showing a SSFP sequence with applying an RF coherent control pulse and a slice gradient magnetic field pulse set by the imaging condition setting unit shown in FIG. 5.

FIG. 8 is a diagram showing a SSFP sequence with applying an RF coherent control pulse and a slice gradient magnetic field pulse set by the imaging condition setting unit 40 shown in FIG. 5.

In FIG. 8, RF denotes RF pulses to be transmitted to the object P, and Gss denotes slice gradient magnetic field pulses to be applied to the object P.

As shown in FIG. 8, in a SSFP sequence with an application of a slice gradient magnetic field pulse Gss, a coherent control block can be set. In a coherent control block, an RF coherent control pulse is applied at the timing each TR/2 temporally away from two adjacent α excitation pulses.

Then, a slice gradient magnetic field pulse can be set in also a coherent control block so that the same slice as the splice excited selectively when an α excitation pulse is applied is excited selectively. If slice exciting positions at applying an excitation pulse and an RF coherent control pulse are mutually identical, an RF coherent control pulse provides an operation similar to that by an inversion pulse such as a saturation recovery (SR) pulse and an IR pulse. That is, on a SSFP sequence, it becomes possible to apply an inversion pulse such as a SR pulse and an IR pulse under the condition on that a spin is excited.

Therefore, a spin which is not excited by an inversion pulse maintains a steady state, and alternatively, a spin excited by an inversion pulse exhibits a signal variation of T1 relaxation degree. In the case of controlling an inversion time, an interval between adjacent inversion pulses may be varied.

Here, when a phase of applied inversion pulse is set to be identical to a phase of excitation pulse applied just before an application of an inversion pulse, there is the advantage to be able to improve the robust effect to ununiformity of RF.

Note that, in the example shown in FIG. 8, a leading-in part G1 of a slice gradient magnetic field pulse Gss applied with an excitation pulse and a leading-in part G2 of a slice gradient magnetic field pulse Gss in a coherent control block are set to be different temporally without overlapping. However setting applications of the leading-in parts G1, G2 with overlapping in a common period is also possible. This point is common in every SSFP sequence described later, which has a coherent control block with an application of a slice gradient magnetic field pulse Gss.

Figure 9:
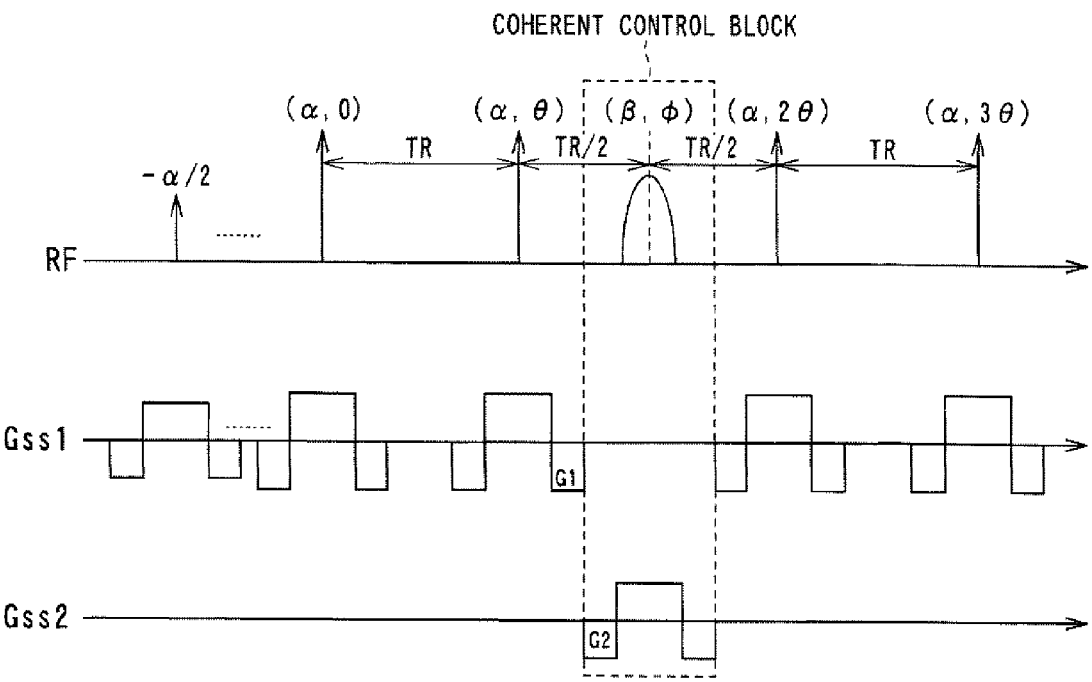
FIG. 9 is a diagram showing a SSFP sequence of which slice to be selectively excited by a coherent control block is set to a slice different from one to be selectively excited at timing for applying an excitation pulse by the imaging condition setting unit shown in FIG. 5.

FIG. 9 is a diagram showing a SSFP sequence of which slice to be selectively excited by a coherent control block is set to a slice different from one to be selectively excited at timing for applying an excitation pulse by the imaging condition setting unit 40 shown in FIG. 5.

In FIG. 9, RF denotes RF pulses to be transmitted to the object P, and Gss1 denotes a slice gradient magnetic field pulse to be applied to the object P for selecting a slice to which an excitation pulse is to be applied, and Gss denotes a slice gradient magnetic field pulse to be applied to the object P for selecting a slice to which a coherent control block, i.e., an RF coherent control pulse.

A coherent control block can be set in a SSFP sequence with an application of a slice gradient magnetic field pulse Gss. As shown in FIG. 9, a slice for applying an excitation pulse and a slice for applying an RF coherent control pulse can be set in mutually different directions. In this case, the application direction of a slice gradient magnetic field pulse Gss1 applied with an excitation pulse and the application direction of a slice gradient magnetic field pulse Gss2 applied with an RF coherent control pulse become mutually different.

There is a representative example that the application direction of a slice gradient magnetic field pulse Gss2 applied with an RF coherent control pulse is set in an RO direction at right angle to the application direction of a slice gradient magnetic field pulse Gss1 applied with an excitation pulse.

Therefore, a spin included in the two slices of a slice excited selectively when an excitation pulse is applied and a slice excited selectively when an RF coherent control pulse is applied, i.e., a spin under two slice selective excitations is saturated or labeled by an RF coherent control pulse in a coherent control block. Alternatively, a spin included in only a slice excited selectively when an excitation pulse is applied, i.e., a spin under only slice selective excitation when an excitation pulse is applied maintains a steady state rigorously.

Consequently, an RF coherent control pulse in a coherent control block functions as a saturation pulse and a spin labeling pulse. The imaging condition described above is suitable, for example, in the case of suppressing signals from unnecessary regions or observing that a spin moves in a specific plane.

Figure 10:
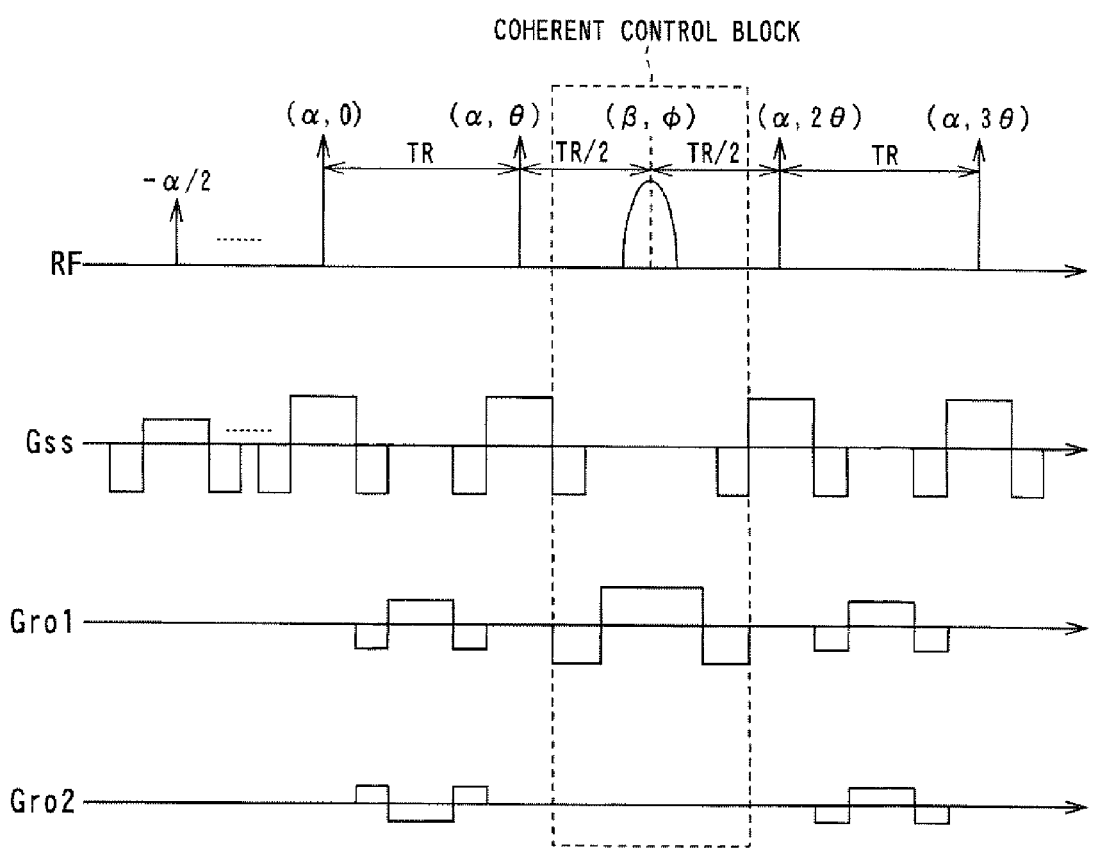
FIG. 10 is a diagram showing an example of a SSFP sequence, having a coherent control block with use of radial acquisition, set by the imaging condition setting unit shown in FIG. 5.

FIG. 10 is a diagram showing an example of a SSFP sequence, having a coherent control block with use of radial acquisition, set by the imaging condition setting unit 40 shown in FIG. 5.

In FIG. 10, RF denotes RF pulses to be transmitted to the object P, and Gss denotes a slice gradient magnetic field pulse to be applied to the object P, and each of Gro1 and Gro2 denotes a RO gradient magnetic field pulse to be applied to the object P.

The SSFP sequence as shown in FIG. 10 is a sequence in the case of using the radial acquisition as a data acquisition. The radial acquisition is an acquisition method for radially acquiring data passing the origin in k-space with changing a gradient magnetic field. It is known that artifact is reduced in the case of imaging a fluid such as a blood and a cerebrospinal fluid (CSF) and active organs in the radial acquisition.

In also this SSFP sequence for radial acquisition, a coherent control block is configured so that zero-order and first-order moment of an RO gradient magnetic field pulse is zero. Then, in a coherent control block, an inversion pulse for labeling fluid such as a blood and a CSF and active organs and another any inversion pulse having a purpose except labeling can be applied. When a coherent control block is set in a SSFP sequence for radial acquisition, the phase of stationary spin and the phase of moving spin at a constant velocity are constantly rephased. This allows to depict active parts such as a fluid more satisfactorily and to obtain an image with a few artifacts.

Figure 11:
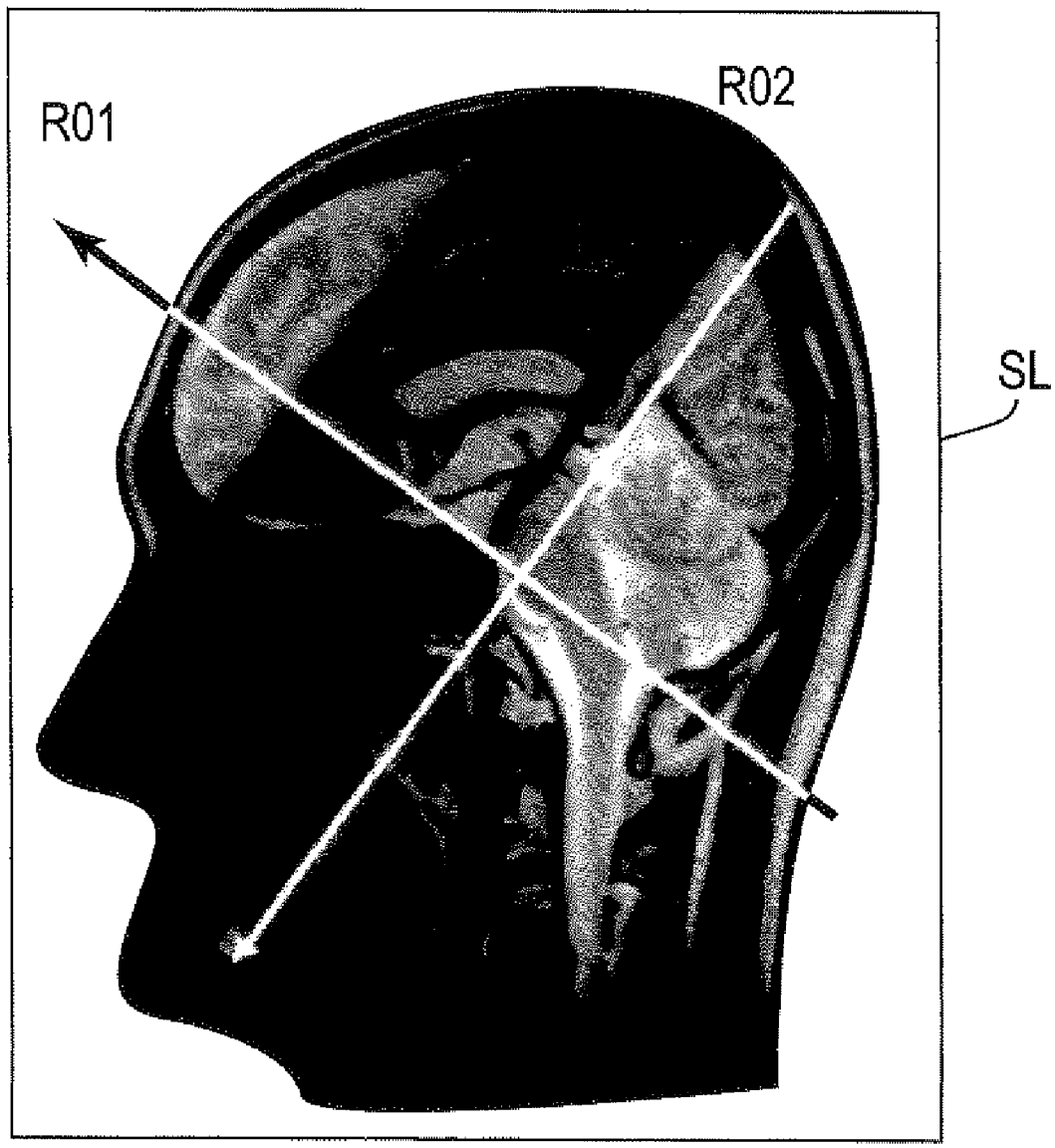
FIG. 11 is a diagram showing a slice axis of spins to be labeled in radial acquisition by the SSFP sequence shown in FIG. 10.

FIG. 11 is a diagram showing a slice axis of spins to be labeled in radial acquisition by the SSFP sequence shown in FIG. 10.

In FIG. 11, RO1 axis shows a start axis for radial acquisition and RO2 axis is an axis perpendicular to the RO1 axis. The RO1 axis and the RO2 axis correspond to application directions of RO gradient magnetic field pulses Gro1, Gro2 respectively. Therefore, the plane including the RO1 axis (the plane excited by the RO gradient magnetic field pulse Gro1) and the plane including the RO2 axis (the plane excited by the RO gradient magnetic field pulse Gro2) are planes perpendicular to the slice SL excited selectively by the slice gradient magnetic field pulse Gss respectively.

In radial acquisition, on the slice SL excited selectively, k-space data is acquired to rotate around the point at the intersection of the start axis RO1 for radial acquisition with RO2 axis perpendicular to the RO1 axis. The slice for labeling is set on the plane perpendicular to the slice SL which includes the start axis RO1 for radial acquisition and is excited selectively by the slice gradient magnetic field pulse Gss. That is, as shown in FIG. 10, when component of the RO gradient magnetic field pulse Gro2 in the RO2 axis direction is zero, a coherent inversion pulse is applied for labeling. While, when component of the RO gradient magnetic field pulse Gro2 in the RO2 axis direction isn't zero, data acquisition is performed.

When spin labeling is performed under the imaging condition as described above, the spin on the plane perpendicular to the slice SL on the start axis RO1 for radial acquisition is labeled. On the contrary, a steady state of the spin is maintained outside of the plane perpendicular to the slice SL on the start axis RO1 for radial acquisition. That is, the only labeled spins are depicted at the positions after moving. Thus, radial acquisition makes it possible to image with suppressing the effect of movement.

Further, a set of plural coherent control blocks can be set so that operation such as a fat saturation and/or labeling is obtained by RF coherent control pulses which are included in the set of plural coherent control blocks.

For example, two pulses of the first fat saturation pulse and the second fat saturation pulse which is applied posterior to the first fat saturation pulse can be added as a set of plural RF coherent control pulses. In this case, when an interval between the application time of the first fat saturation pulse and the application time of the second fat saturation pulse and an interval between the application time of the second fat saturation pulse and the application time of a desired exciting pulse for imaging are controlled so as to obtain fat saturation effect at application time of the desired excitation pulse for imaging which needs to obtain fat saturation effect, fat saturation effect obtained by applying two fat saturation pulses can be obtained in data acquisition by a SSFP sequence. The case that over three fat saturation pulses are applied as a set of plural RF coherent control pulses is also similar.

Particularly, it is preferable to set the pulse length of a fat saturation pulse long for improving fat saturation effect. However, under a restriction with regard to TR, there is the case that setting the pulse length of a fat saturation pulse long sufficiently is difficult. Consequently, plural fat saturation pulses with restricted frequency characteristics are applied, and then it is favorable to obtain fat saturation effect equivalent to that in a case to apply a fat saturation pulse with frequency characteristic to set originally. That is, it is possible to obtain fat saturation effect equivalent to that in a case to apply a fat saturation pulse with appropriate frequency characteristic which is settable without consideration of TR by applying plural divided fat saturation pulses.

As another example, a fat saturation pulse and a pulse for labeling can be also added as a set of plural RF coherent control pulses. In this case, both a fat saturation and labeling can be performed on data acquisition under a SSFP sequence. Note that, it is necessary to control an interval between application time of the fat saturation pulse and application time of a desired excitation pulse for imaging which needs to obtain fat saturation effect for obtaining fat saturation effect at the application time of the excitation pulse.

Additionally, as another example, plural pulses for labeling can also added as a set of plural coherent control pulses. For example, when a Tag pulse for labeling is applied, there is a case the power needed to be provided to the Tag pulse cannot be obtained due to the restriction on hardware configuration. Then, the magnetization to be a target for labeling can be tilted by 180-degree by applying multiple Tag pulses. Labeling methods with applying plural pulses for labeling include t-SLIP (Time-Slip: Time Spatial Labeling Inversion Pulse) method.

In the t-SLIP method, a t-SLIP pulse is applied to label blood flowing into an imaging region. That is, a t-SLIP sequence is an imaging sequence with application of an ASL (arterial spin-labeling) pulse for depicting or suppressing tagged blood selectively by tagging blood flowing into an imaging cross section. The t-SLIP sequence mentioned above allows signal intensity of only a blood to reach to an imaging cross section after an inversion time (TI) to be weighted or suppressed selectively. Note that, as needed, a t-SLIP pulse is applied after a lapse of constant delay time from an R wave of an ECG (electrocardiogram) signal and imaging can be performed in synchronized with electrocardiogram.

A t-SLIP pulse is configured with a region non-selective inversion pulse and a region selective inversion pulse. A region non-selective inversion pulse can be switched back and forth between ON and OFF. That is, a t-SLIP pulse includes a region selective inversion pulse at least, and there is a case that the t-SLIP pulse is configure with only a region selective inversion pulse and a case that the t-SLIP pulse is configure with both of a region selective inversion pulse and a region non-selective inversion pulse.

A region selective inversion pulse can be set independent from an imaging cross section arbitrarily. When a blood flowing into an imaging region is labeled by the region selective inversion pulse mentioned above, signal intensity of the part where blood reaches becomes high after a TI. Note that, when a region non-selective inversion pulse is turned off, signal intensity of the part where a blood reaches becomes low after a TI. This allows figuring out a moving direction and distance of a blood.

Therefore, a region non-selective inversion pulse and a region selective inversion pulse in the t-SLIP method are added to a SSFP sequence as a set of plural coherent control pulses for labeling.

Note that, in labeling under the t-SLIP method, when a pulse for labeling is applied after a predetermined delay time from a reference wave of an ECG signal in synchronized with ECG information, an ECG unit 38 is provided with the magnetic resonance imaging apparatus 20 to obtain an ECG signal of an object P. The magnetic resonance imaging apparatus 20 is configured so that an ECG signal acquired by the ECG unit 38 is output at the computer 32 through the sequence controller 31. A peripheral pulse gating (PPG) signal may be also acquired instead of the ECG signal. A PPG signal is a signal to detect a pulse wave of fingertip as a light signal for example. In the case of acquiring a PPG signal, a PPG signal detection unit is provided.

Figure 12:
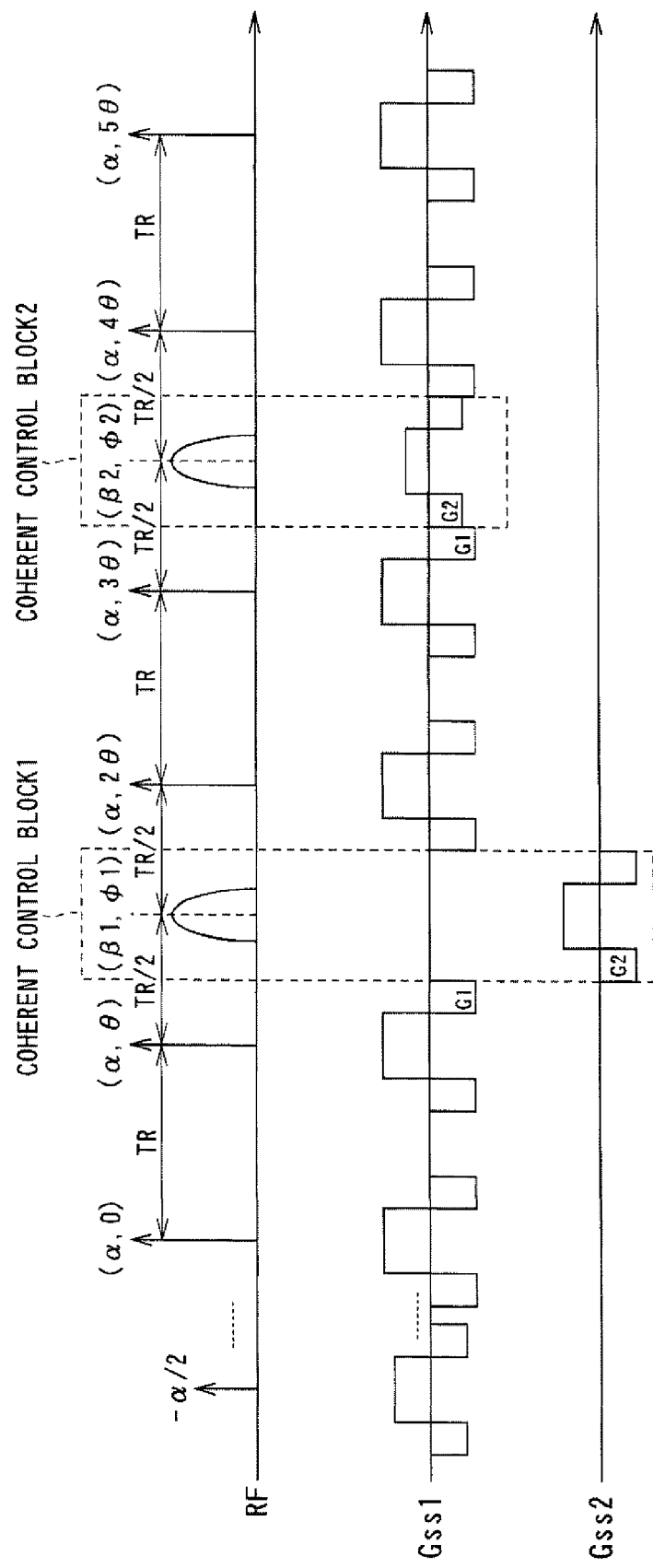
FIG. 12 is a diagram showing an example of SSFP sequence, having plural coherent blocks with applying pulses for labeling, set by the imaging condition setting unit shown in FIG. 5.

FIG. 12 is a diagram showing an example of SSFP sequence, having plural coherent blocks with applying pulses for labeling, set by the imaging condition setting unit 40 shown in FIG. 5.

In FIG. 12, RF denotes RF pulses to be transmitted to the object P, and Gss1 denotes slice gradient magnetic field pulses to be applied to the object P for selecting slices to which excitation pulses and a region non-selective inversion pulse are applied, and Gss2 denotes a slice gradient magnetic field pulse to be applied to the object P for selecting a slice to which a region selective inversion pulse is applied.

As shown in FIG. 12, two of the first and the second coherent control blocks can be set in the SSFP sequence. In the first and the second coherent control blocks, applications of the first ($\beta 1$, $\phi 1$) RF coherent control pulse and the second ($\beta 2$, $\phi 2$) RF coherent control pulse can be set respectively. For example, the first and the second RF coherent control pulse mentioned above can be set as a region selective inversion pulse and a region non-selective inversion pulse as the first and the second labeling pulses respectively.

Since a region selective inversion pulse can select application cross section independent of an imaging cross section arbitrarily, a slice gradient magnetic field pulse for selecting a slice different from a slice excited selectively for imaging is applied with a region selective inversion pulse. On the contrary, since a region non-selective inversion pulse is applied in an imaging region, a slice gradient magnetic field pulse for selecting a slice parallel to the slice selected for imaging is applied with a region non-selective inversion pulse.

Then, other functions of the computer 32 will be described.

The sequence controller control unit 41 built in the computer 32 has a function for controlling the driving of the sequence controller 31 by giving imaging conditions including a pulse sequence, acquired from the imaging condition setting unit 40, to the sequence controller 31 based on information instructing imaging start from the input device 33 or another element and a function for receiving raw data which is k-space (Fourier space) data from the sequence controller 31 and arranging the raw data to k space formed in the k-space database 42.

Therefore, the k-space database 42 stores the raw data generated by the receiver 30 as k space data.

The image reconstruction unit 44 has a function for generating image data from k-space data by capturing the k-space data from the k-space database 42 and performing image reconstruction processing such as two or three dimensional of Fourier transform processing to the k-space data, and writing the generated image data to the image database 44.

The image processing unit 45 has a function to read image data from the image database 44 and perform necessary image processing and a function to display image data after image processing on the display unit 34. Specifically, the image processing unit 45 has a function to perform subtraction processing between image data obtained from pieces of data acquired before and after a coherent control block set on a SSFP sequence respectively and a function to display subtraction image data obtained by subtraction processing as image data for display on the display unit 34. That is, the image processing unit 45 has a function to generate image data by a subtraction method. Specifically, in case of labeling, needs to apply a subtraction method to image data before and after labeling is exposed.

Figure 13:
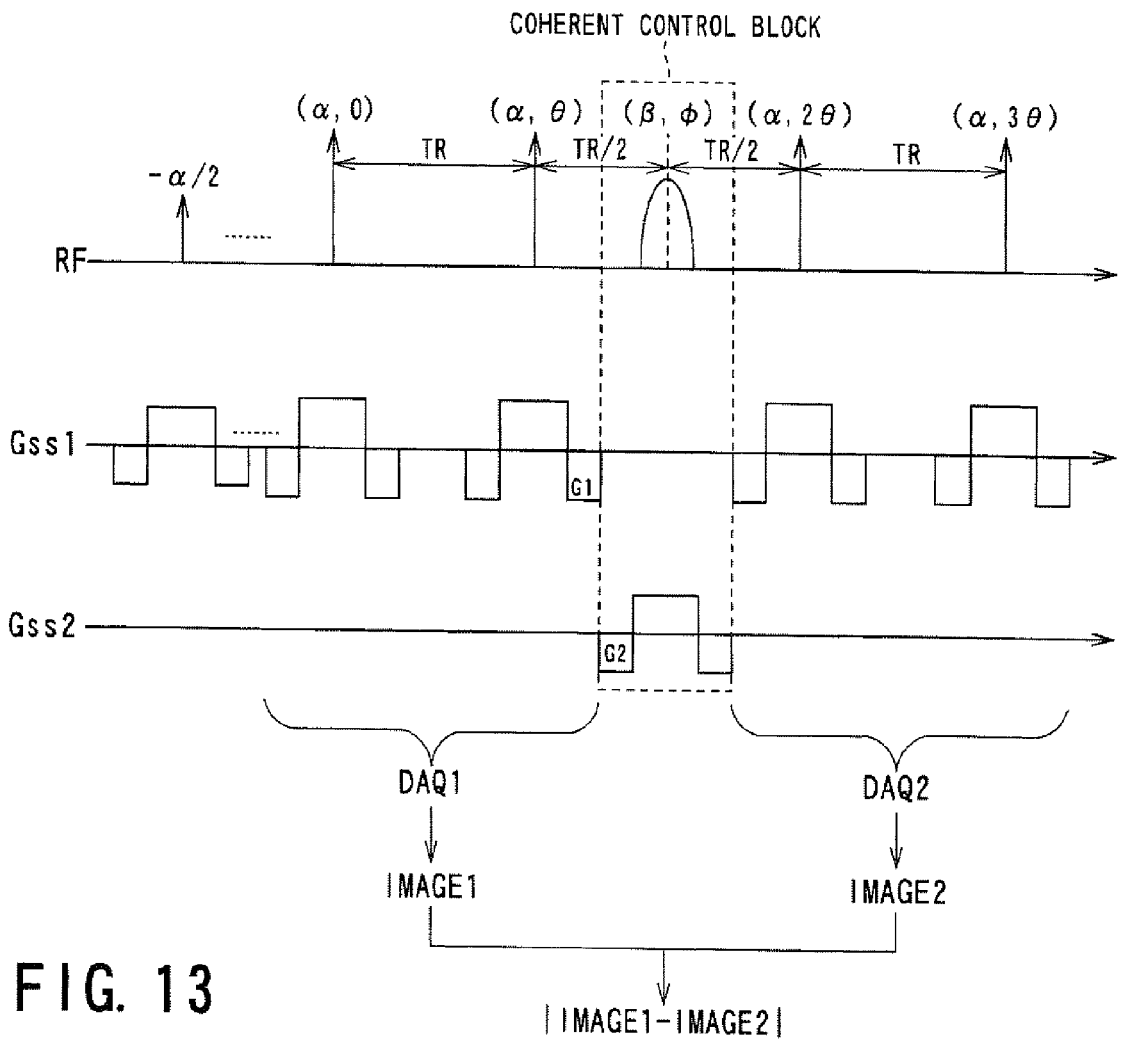
FIG. 13 is a diagram explaining a method for selectively depicting spins with motion under subtraction processing by the image processing unit shown in FIG. 5; and, FIG. 14 is a flowchart showing an example of procedure for imaging by using a SSFP sequence with applying a coherent control pulse for a desired object such as fat-saturation, labeling and inversion by the magnetic resonance imaging apparatus shown in FIG. 4.

FIG. 13 is a diagram explaining a method for selectively depicting spins with motion under subtraction processing by the image processing unit 45 shown in FIG. 5.

In FIG. 13, RF denotes RF pulses to be transmitted to the object P, and Gss1 denotes slice gradient magnetic field pulses for excitation pulses, and Gss2 denotes a slice gradient magnetic field pulse for coherent control block, i.e., a RF coherent control pulse.

As shown in FIG. 13, while data acquisition period before a coherent control block of the SSFP sequence shown in FIG. 9 is defined as the first data acquisition period DAQ1, data acquisition period after the coherent control block is defined as the second data acquisition period DAQ2. Then, when the image reconstruction unit 43 is configured so that the first image data IMAGE1 is reconstructed using k-space data acquired in the first data acquisition period DAQ1 while the second image data IMAGE2 is reconstructed using k-space data acquired in the second data acquisition period DAQ2, the first image data IMAGE1 corresponding to the first data acquisition period DAQ1 and the second image data IMAGE2 corresponding to the second data acquisition period DAQ2 are stored in the image database 44 respectively.

Then, the image processing unit 45 is configured to generate subtraction image data |IMAGE1−IMAGE2| which only a moving spin is depicted selectively by subtraction processing between the first image data IMAGE1 and the second image data IMAGE2. That is, though a target spin isn't labeled with regard to the first image data IMAGE1 obtained from data before the coherent control block, a target spin is labeled with regard to the second image data IMAGE2 obtained from data after the coherent control block by an inversion pulse. On the other hand, the spin under only a slice selective excitation when an excitation pulse is applied maintains a steady state rigorously before and after a coherent control block. Therefore, when subtraction processing is performed between the first image data IMAGE1 and the second image data IMAGE2, data from a spin under the steady state is cancelled and only data from a labeled spin is remained as the subtraction image data |IMAGE1−IMAGE2|.

Note that, the sufficient number of excitation is needed so that spins become under the steady state in the first data acquisition period DAQ1.

Subtraction processing between image data obtained respectively from acquisition data before and after a coherent control block can be performed not only in case of the imaging condition shown in FIG. 9 but also likewise in case of the imaging condition shown in FIG. 6, FIG. 8, or FIG. 10. For example, image data of a moving spin can be obtained selectively by setting the first data acquisition period DAQ1 and the second data acquisition period DAQ2 for the radial acquisition shown in FIG. 10 and subtracting image data.

Next, the operation and action of a magnetic resonance imaging apparatus 20 will be described.

Figure 14:
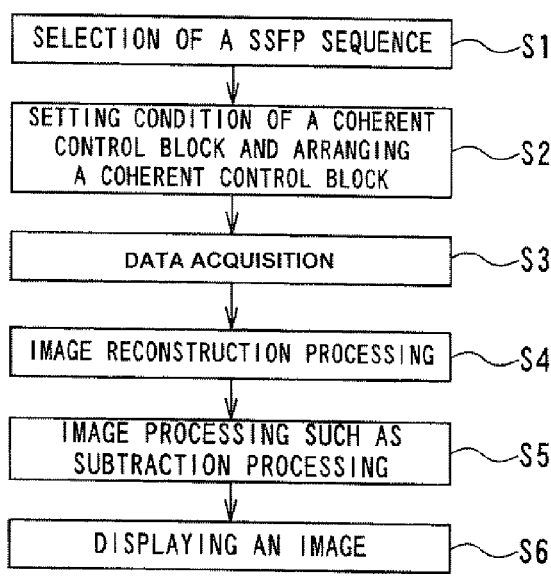

FIG. 14 is a flowchart showing an example of procedure for imaging by using a SSFP sequence with applying a coherent control pulse for a desired object such as fat-saturation, labeling and inversion by the magnetic resonance imaging apparatus 20 shown in FIG. 4. The symbols including S with a number in FIG. 14 indicate each step of the flowchart.

First, in step S1, the imaging condition setting unit 40 displays screen information for setting of an imaging condition on the display unit 34. A User browses the screen for setting of an imaging condition, conditions such as selective instruction of a SSFP sequence and an application method of incidental gradient magnetic field pulses are provided to the imaging condition setting unit 40 as information instructing an imaging condition from the input device 33. Then, the imaging condition setting unit 40 sets a SSFP sequence as an imaging condition.

Next, in step S2, instruction information of an imaging condition in a coherent control block is provided to the imaging condition setting unit 40 as information instructing an imaging condition from the input device 33, and is set as an imaging condition in a coherent control block. That is, a waveform, an excitation angle and an excitation phase of an RF coherent control pulse in a coherent control block are determined according to an application purpose of the coherent control pulse. An application method of gradient magnetic field pulses in the coherent control block is also determined according to an imaging purpose.

Subsequently, in step S3, data acquisition is performed according to the imaging condition set by the imaging condition setting unit 40.

That is, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

The input device 33 sends instruction of data acquisition to the sequence controller control unit 41. The sequence controller control unit 41 supplies a SSFP sequence having a coherent control block received from the imaging condition setting unit 40 to the sequence controller 31. Therefore, the sequence controller 31 drives the gradient power supply 27, the transmitter 29, and the receiver 30 in accordance with the SSFP sequence received from the sequence controller control unit 41, thereby generating a gradient magnetic field at the imaging area having the set object P, and further generating RF signals from the RF coil 24.

Consequently, the RF coil 24 receives NMR signals generated due to nuclear magnetic resonance in the object P. Then, the receiver 30 receives the NMR signals from the RF coil 24 and generates raw data. The receiver 30 supplies the generated raw data to the sequence controller 31. The sequence controller 31 supplies the raw data received from the receiver 30 to the sequence controller control unit 41. The sequence controller control unit 41 arranges the raw data as k-space data to the k space generated in the k-space database 42.

Note that, since the coherent control block to apply the coherent control pulse is set in the SSFP sequence, the k-space data from the excited target spins out of k-space data acquired after the coherent control block is under the operation of the coherent control pulse. Alternatively, a steady state of no-target spins is maintained rigorously before and after the coherent control block since zero-order moment amount is adjusted to be zero in the coherent control block so as to maintain the phases of no-target spins.

Subsequently, in step S4, the image reconstruction unit 44 reads the k-space data from the k-space database 42 and performs image reconstruction processing to the read k-space data, thereby generating image data. The generated image data is written and stored in the image database 44.

Subsequently, in step S5, the image processing unit 45 reads the image data form the image database 44 and performs necessary image processing, thereby generating image data for display. For example, the image processing unit 45 generates image data in which moving spins are depicted selectively by subtraction processing between the image data obtained respectively from the data acquired before and after the coherent control blocks set on the SSFP sequence.

Subsequently, in step S6, the image processing unit 45 supplies the image data generated by the image processing to the display unit 34. Consequently, the image which the image contrast of the part including the target spins is varied by the coherent control pulse in the coherent control block is displayed on the display unit 34.

That is, the magnetic resonance imaging apparatus 20 as mentioned above is an apparatus configured that a coherent spin can be added to a SSFP sequence as one of imaging conditions. Therefore, variation of the image contrast by a coherent control pulse can be realized with maintaining phase continuity of a spin in a SSFP sequence by the magnetic resonance imaging apparatus 20.

In addition, when an application method of a slice gradient magnetic field pulse in a coherent control block is set differently from an application method of a slide gradient magnetic field pulse when an excitation pulse for excitation is applied, the spins excited by both of the slice gradient magnetic field pulse in the coherent control block and the slice gradient magnetic field pulse when the excitation pulse is applied can be labeled selectively. In this case, the steady state of the spins excited by only the slice gradient magnetic field pulse when the excitation pulse is applied can also be maintained rigorously.

Further, moving spins can be labeled selectively to depict the move of spins by setting a coherent control block in a SSFP sequence for radial data acquisition.

What is claimed is:

1. A magnetic resonance imaging apparatus comprising:
a data acquisition unit configured to acquire data according to a sequence derived by adding a coherent control pulse on a Steady-State Free Precession pulse sequence for repeating plural radio frequency excitations with a constant interval, the coherent control pulse having a center at a substantially center time between adjacent radio frequency excitations and a zero-order moment of which amount is zero; and
an image data generating unit configured to generate image data based on the data.

2. A magnetic resonance imaging apparatus of claim 1, wherein said data acquisition unit is configured to acquire the data with adding a gradient magnetic field pulse for the coherent control pulse so as to excite a same slice as a slice excited by each gradient magnetic field pulse applied at the plural radio frequency excitations when the coherent control pulse is applied.

3. A magnetic resonance imaging apparatus of claim 1, wherein said data acquisition unit is configured to acquire the data with adding a gradient magnetic field pulse for the coherent control pulse so as to excite a slice different from a slice excited by each gradient magnetic field pulse applied at the plural radio frequency excitations when the coherent control pulse is applied.

4. A magnetic resonance imaging apparatus of claim 1, wherein said data acquisition unit is configured to acquire the data with setting an application phase of the coherent control pulse to a same phase as one of a radio frequency excitation pulse applied just before an application of the coherent control pulse.

5. A magnetic resonance imaging apparatus of claim 1, wherein said data acquisition unit is configured to acquire the data with adding the coherent control pulse as a fat-saturation pulse.

6. A magnetic resonance imaging apparatus of claim 1, wherein said data acquisition unit is configured to acquire the data with adding the coherent control pulse as a pulse for labeling.

7. A magnetic resonance imaging apparatus of claim 1, wherein said data acquisition unit is configured to acquire the data with adding the coherent control pulse as an inversion recovery pulse or a saturation recovery pulse.

8. A magnetic resonance imaging apparatus of claim 1, wherein said data acquisition unit is configured to acquire the data according to a Steady-State Free Precession pulse sequence for radial acquisition.

9. A magnetic resonance imaging apparatus of claim 1, wherein said image data generating unit is configured to generate first image data from first data acquired before applying the coherent control pulse and second image data from second data acquired after applying the coherent control pulse respectively and perform subtraction processing between the first image data and the second image data.

10. A magnetic resonance imaging apparatus of claim 1, wherein said data acquisition unit is configured to acquire the data with adding a set of plural coherent control pulses.

11. A magnetic resonance imaging apparatus of claim 10, wherein said data acquisition unit is configured to acquire the data according to a sequence with adding a first fat-saturation pulse and a second fat-saturation pulse as the set of the plural coherent control pulses, a first interval between application timings of the first fat-saturation pulse and the second fat-saturation pulse and a second interval between application timings of the second fat-saturation pulse and a desired imaging pulse being determined so as to obtain fat suppression effect at a time for applying the desired imaging pulse.

12. A magnetic resonance imaging apparatus of claim 10, wherein said data acquisition unit is configured to acquire the data with adding a region non-selective inversion pulse which is a pulse applied to an imaging region for labeling and a region selective inversion pulse which is a pulse applied to a region set independently from an imaging section for labeling as the set of the plural coherent control pulses.

13. A magnetic resonance imaging apparatus of claim 10, wherein said data acquisition unit is configured to acquire the data according a sequence with adding a fat-saturation pulse and a pulse for labeling as the set of the plural coherent control pulses, an interval between application timings of the fat-saturation pulse and the pulse for labeling being determined so as to obtain fat suppression effect at a time for applying a desired imaging pulse.

14. A magnetic resonance imaging method comprising:
acquiring data according to a sequence derived by adding a coherent control pulse on a Steady-State Free Precession pulse sequence for repeating plural radio frequency excitations with a constant interval, the coherent control pulse having a center at a substantially center time between adjacent radio frequency excitations and a zero-order moment of which amount is zero; and
generating image data based on the data.

15. A magnetic resonance imaging method of claim 14, wherein the data is acquired with adding a gradient magnetic field pulse for the coherent control pulse so as to excite a same slice as a slice excited by each gradient magnetic field pulse applied at the plural radio frequency excitations when the coherent control pulse is applied.

16. A magnetic resonance imaging method of claim 14, wherein the data is acquired with adding a gradient magnetic field pulse for the coherent control pulse so as to excite a slice different from a slice excited by each gradient magnetic field pulse applied at the plural radio frequency excitations when the coherent control pulse is applied.

17. A magnetic resonance imaging method of claim 14, wherein the data is acquired with setting an application phase of the coherent control pulse to a same phase as one of a radio frequency excitation pulse applied just before an application of the coherent control pulse.

18. A magnetic resonance imaging method of claim 14, wherein the data is acquired with adding the coherent control pulse as a fat-saturation pulse.

19. A magnetic resonance imaging method of claim 14, wherein the data is acquired with adding the coherent control pulse as a pulse for labeling.

20. A magnetic resonance imaging method of claim 14, wherein the data is acquired with adding the coherent control pulse as an inversion recovery pulse or a saturation recovery pulse.

21. A magnetic resonance imaging method of claim 14, wherein the data is acquired according to a Steady-State Free Precession pulse sequence for radial acquisition.

22. A magnetic resonance imaging method of claim 14, wherein first image data from first data acquired before applying the coherent control pulse and second image data from second data acquired after applying the coherent control pulse are generated respectively and subtraction processing between the first image data and the second image data is performed.

23. A magnetic resonance imaging method of claim 14, wherein the data is acquired with adding a set of plural coherent control pulses.

24. A magnetic resonance imaging method of claim 23, wherein the data is acquired according to a sequence with adding a first fat-saturation pulse and a second fat-saturation pulse as the set of the plural coherent control pulses, a first interval between application timings of the first fat-saturation pulse and the second fat-saturation pulse and a second interval between application timings of the second fat-saturation pulse and a desired imaging pulse being determined so as to obtain fat suppression effect at a time for applying the desired imaging pulse.

25. A magnetic resonance imaging method of claim 23, wherein the data is acquired with adding a region non-selective inversion pulse which is a pulse applied to an imaging region for labeling and a region selective inversion pulse which is a pulse applied to a region set independently from an imaging section for labeling as the set of the plural coherent control pulses.

* * * * *